(12) United States Patent
Huang et al.

(10) Patent No.: US 11,868,014 B2
(45) Date of Patent: Jan. 9, 2024

(54) ARRAY SUBSTRATE, MANUFACTURING METHOD FOR ARRAY SUBSTRATE AND DISPLAY DEVICE

(71) Applicant: HKC CORPORATION LIMITED, Shenzhen (CN)

(72) Inventors: Shishuai Huang, Shenzhen (CN); Bing Han, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/994,642

(22) Filed: Nov. 28, 2022

(65) Prior Publication Data

US 2023/0194938 A1 Jun. 22, 2023

(51) Int. Cl.
| | |
|---|---|
| *G02F 1/1362* | (2006.01) |
| *G02F 1/1333* | (2006.01) |
| *G02F 1/1343* | (2006.01) |
| *H01L 27/12* | (2006.01) |
| *G02F 1/1337* | (2006.01) |

(52) U.S. Cl.
CPC .... *G02F 1/136222* (2021.01); *G02F 1/13439* (2013.01); *G02F 1/133357* (2021.01); *G02F 1/134309* (2013.01); *G02F 1/136209* (2013.01); *G02F 1/136286* (2013.01); *H01L 27/1244* (2013.01); *H01L 27/1248* (2013.01); *H01L 27/1259* (2013.01); *G02F 1/1337* (2013.01)

(58) Field of Classification Search
CPC ......... G02F 1/133357; G02F 1/134309; G02F 1/13439; G02F 1/136286; G02F 1/1337; G02F 1/136222; H01L 27/1244; H01L 27/1248; H01L 27/1259

See application file for complete search history.

(56) References Cited

U.S. PATENT DOCUMENTS

| | | | | |
|---|---|---|---|---|
| 2006/0232529 | A1* | 10/2006 | Midorikawa | G02F 1/133514 345/87 |
| 2015/0029080 | A1 | 1/2015 | Kwon et al. | |
| 2016/0274427 | A1* | 9/2016 | Lien | G02F 1/1368 |

FOREIGN PATENT DOCUMENTS

| | | |
|---|---|---|
| CN | 102945827 A | 2/2013 |
| CN | 104730780 A | 6/2015 |
| CN | 105607368 A | 5/2016 |
| KR | 20140098401 A | 8/2014 |

* cited by examiner

*Primary Examiner* — James A Dudek
(74) *Attorney, Agent, or Firm* — Maier & Maier, PLLC

(57) ABSTRACT

Provided is an array substrate, a manufacturing method for an array substrate, and a display panel. The array substrate includes a first substrate base, common electrode lines, a color filter layer, and a planarization layer; the color filter layer includes first color filters and a second color filters, forming color filter channels therebetween on the common electrode lines, so as to avoid overlapping between the first color filters and the second color filters. The width of the common electrode lines is relatively small, ensuring a high aperture rate of the array substrate. Additionally, the array substrate further includes a planarization layer filled in the color filter channels, this minimizes the color filter channels to ensure flatness between the first color filters and the second color filters, so that etching residues in the color filter channels can be avoided when forming the pixel electrode layer.

14 Claims, 8 Drawing Sheets

A-A

B-B

ARRAY SUBSTRATE, MANUFACTURING METHOD FOR ARRAY SUBSTRATE AND DISPLAY DEVICE

CROSS-REFERENCE TO RELATED APPLICATIONS

This application claims the benefit of Chinese patent application No. 202111552682.3 filed on Dec. 17, 2021, the contents of which are incorporated herein by reference.

TECHNICAL FIELD

The present application relates to display technologies, and in particular, to an array substrate, a manufacturing method for an array substrate and a display device.

Background Signal transmissions in LCD panels usually require the use of source chip on film (source COF) and gate chip on film (gate COF). With the development of gate driver on array (GOA) technology, and its application which is becoming more and more extensive, gate COF is no longer in use, and the drive cost is mainly spent on source COF, so the cost of LCD panel can be effectively reduced by reducing the number of source COF. With a fixed resolution of the LCD panel, the number of source COFs can be further reduced by changing the drive method to reduce the number of source drive lines (i.e., data lines).

Accordingly, dual rate drive (DRD) technology has emerged in order to reduce the use of data lines: one data line is connected to both left and right columns of sub-pixels, and the scanning lines are doubled, with two scanning lines between two adjacent rows of sub-pixels. In this DRD type of display panel, color filter on thin film transistor (COT) technology is usually used to reduce the adverse effects of the double in scanning line which results in a reduction of the aperture rate and loads on the data line.

A light-shielding electrode of the same potential as the common electrode is arranged above the data line, namely above the intersection of the color filter layers of the two sub-pixels connected to the same data line, to replace the black matrix on the color filter (CF) substrate on the opposite side and improve the transmission rate. Whereas for two adjacent sub-pixels connected to two adjacent data lines, respectively, the only way to shield the area between the two sub-pixels is through the common electrode line. This causes the two color filter layers overlap, and the common electrode line needs to be widened in order to prevent color mixing between those two sub-pixels, which can lead to a relatively lower aperture rate.

SUMMARY

An embodiment of the present application provides an array substrate, to solve the technical problem of reduced aperture rate in existing display panels caused by the widening of the common electrode line due to the overlapping of the color filter layer of two adjacent sub-pixels above the common electrode line.

An embodiment of the present application provides an array substrate, including:
 a first substrate base; and
 common electrode lines disposed on the first substrate base;
 the array substrate further includes:
 a color filter layer, disposed on the first substrate base, including first color filters and second color filters adjacent to the first color filters, and the first color filters and the second color filters forming color filter channels on the common electrode lines; and
 a planarization layer, the planarization layer including filling portions, which are filled in the color filter channels.

In one embodiment, the array substrate further includes a plurality of data lines disposed on the first substrate base, the data lines are parallel to and alternating with the common electrode lines. The color filter layer further includes third color filters, an edge of each of the third color filters and an edge of respective one of the first color filters overlap over the plurality of data lines.

In one embodiment, the array substrate further includes a pixel electrode layer disposed on the color filter layer, the pixel electrode layer includes a plurality of pixel electrodes, a part of the plurality of pixel electrodes located above the third color filters and another part of the plurality of pixel electrodes located above the first color filters are connected to a same data line.

In one embodiment, the planarization layer further includes transparent planarization portions, the transparent planarization portions are disposed on the color filters and are connected to the filling portions.

In one embodiment, the filling portions and the transparent planarization portions are in a same layer, the planarization layer is provided with orientation grooves, and the plurality of pixel electrodes are disposed on the transparent planarization portions; alternatively, the array substrate further includes an alignment layer, and the alignment layer is disposed on the pixel electrode layer.

In one embodiment, the planarization layer further includes shielding portions disposed above overlapping edges of the third color filters and the first color filters, the shielding portions are parallel to the data lines.

In one embodiment, the array substrate further includes light-shielding electrodes, the light-shielding electrodes are disposed on the shielding portions and connected to the common electrode lines; a width of each of the light-shielding electrodes is greater than a width of each of the data lines.

In one embodiment, a width of each of the shielding portions is greater than the width of each of the light-shielding electrodes, and an excessive width of each of the shielding portions extending beyond each of the light-shielding electrodes is less than or equal to 2 µm.

Another aspect of the present application provides a manufacturing method for an array substrate, which includes:
 forming common electrode lines on a first substrate base; and
 forming a color filter layer on the first substrate base, the color filter layer including first color filters and second color filters, and an edge of each the first color filters and an edge of each of the second color filters forming a color filter channel on a corresponding one of the common electrode lines;
 the manufacturing method further includes: forming a planarization layer on the color filter layer using a transparent material, the planarization layer at least partially fills the color filter channel.

Yet another aspect of the present application provides a display panel, which includes a color film substrate, the array substrate according to aforementioned embodiments, and a liquid crystal layer disposed between the array substrate and the color film substrate.

The beneficial effects of the array substrate, the manufacturing method for an array substrate and the display panel in the embodiments of the present application are as follows.

The array substrate in the embodiments of the present application includes a first substrate base, a common electrode line, a color filter layer and a planarization layer, the color filter layer includes first color filters and second color filters adjacent to the first color filters; a color filter channel is formed between each of the first color filter and each of the second color filter above the common electrode lines to avoid the first color filters and the second color filters from overlapping above the common electrode lines. Since there is no color mixing between the sub-pixels where the first color filters and the second color filters are located respectively, the width required for the common electrode lines can be small, which is favorable to a high aperture rate of the array substrate. In addition, the array substrate also includes a planarization layer with filling portions filled in the color filter channels, which can reduce or even eliminate the color filter channels, so that flatness can be achieved between the first color filters and adjacent second color filters, therefore, when the pixel electrode layer is formed by depositing and etching on the color filter layer, etching residues of transparent conductive material in the color filter channels can be avoided to improve etching yields and ensure display quality.

BRIEF DESCRIPTION OF THE DRAWINGS

In order to more clearly illustrate the technical proposals in embodiments of the present application, accompanying drawings that are used in the description of the embodiments or exemplary technologies are briefly introduced hereinbelow. Obviously, the drawings in the following description are merely some embodiments of the present application. For those skilled in the art, other drawings can also be obtained according to these drawings without any creative effort.

DETAILED DESCRIPTION OF THE EMBODIMENTS

In order to make the purpose, technical proposals, and advantages of the present application more clearly understood, the present application will be described in further detail hereinbelow with reference to the accompanying drawings and embodiments. It should be understood that the specific embodiments described herein are merely used to explain the present application, but not to limit the present application.

It should be noted that when an element is referred to as being "provided" or "set" on another element, it can be directly on the other element or indirectly on the other element. When an element is referred to as being "connected to" another element, it can be directly connected to the other element or indirectly connected to the other element. It is to be understood that the terms "upper", "lower", "left", "right" etc. for indicating orientations or positional relationships refer to orientations or positional relationships as shown in the accompanying drawings; the terms are for the purpose of illustrating the present application and simplifying the description rather than indicating or implying the device or element must have a certain orientation and be structured or operated by the certain orientation, and therefore cannot be regarded as limitation to the present application. The terms "first" and "second" are merely used for descriptive purposes to distinguish objects such as substances from each other, and cannot be understood as indicating or implying relative importance or implying the number of indicated technical features. "A plurality of" means two or more, unless otherwise expressly specified.

First Embodiment

Figure 1:
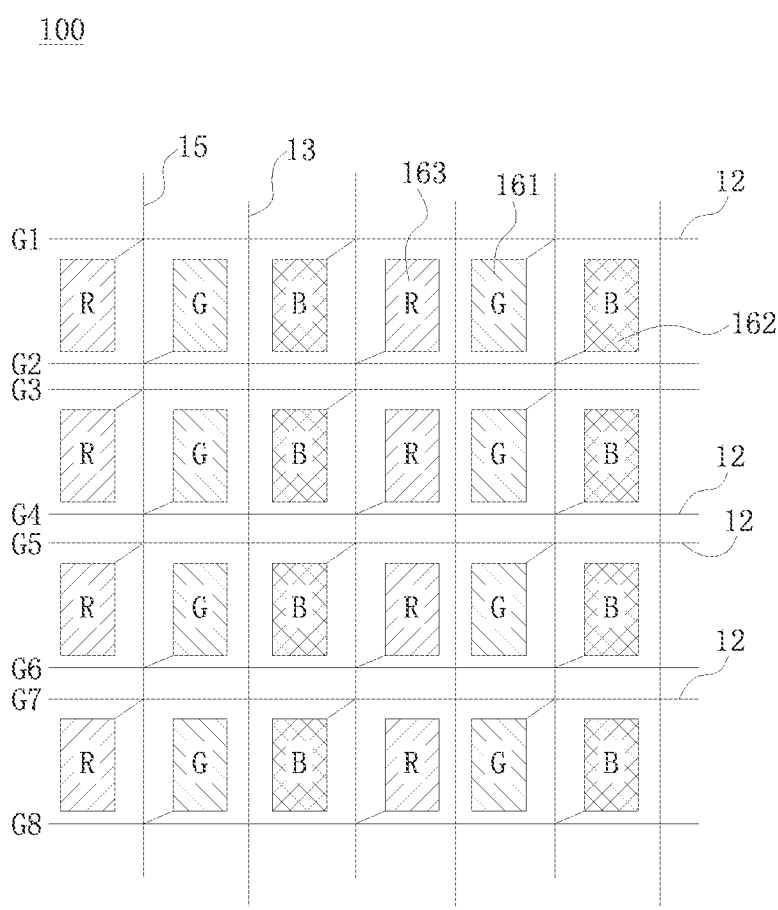
FIG. 1 is a schematic diagram showing the structure of the pixels of the array substrate according to an embodiment of the present application.
Figure 3:
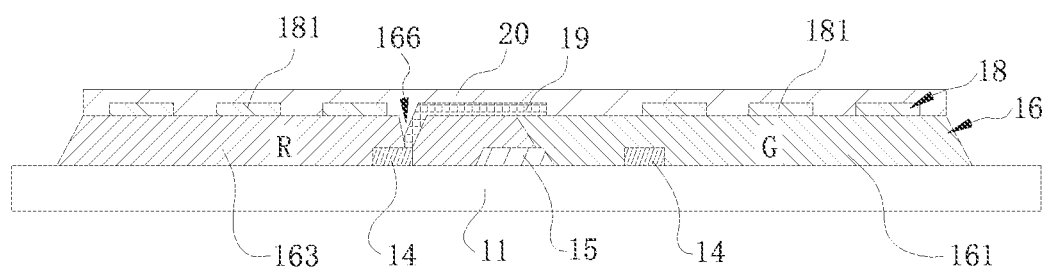
FIG. 3 is a cross-sectional view of the array substrate taken along line A-A according to a first embodiment of the present application.
Figure 4:
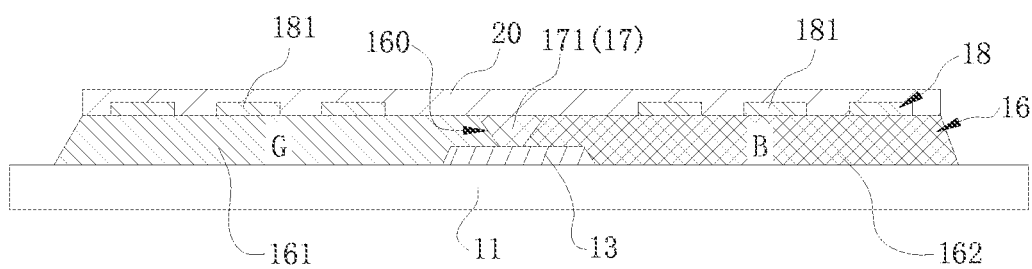
FIG. 4 is a cross-sectional view of the array substrate taken along line B-B according to the first embodiment of the present application.

Referring to FIGS. 1, 3 and 4, an embodiment of the present application provides an array substrate 100, which includes: a first substrate base 11, common electrode lines 13 and data lines 15 disposed on the first substrate base 11, a color filter layer 16 disposed on the common electrode lines 13 and the data lines 15, and a pixel electrode layer 18 disposed on the color filter layer 16. Thus, the array substrate 100 is a COT-type array substrate.

Figure 2:
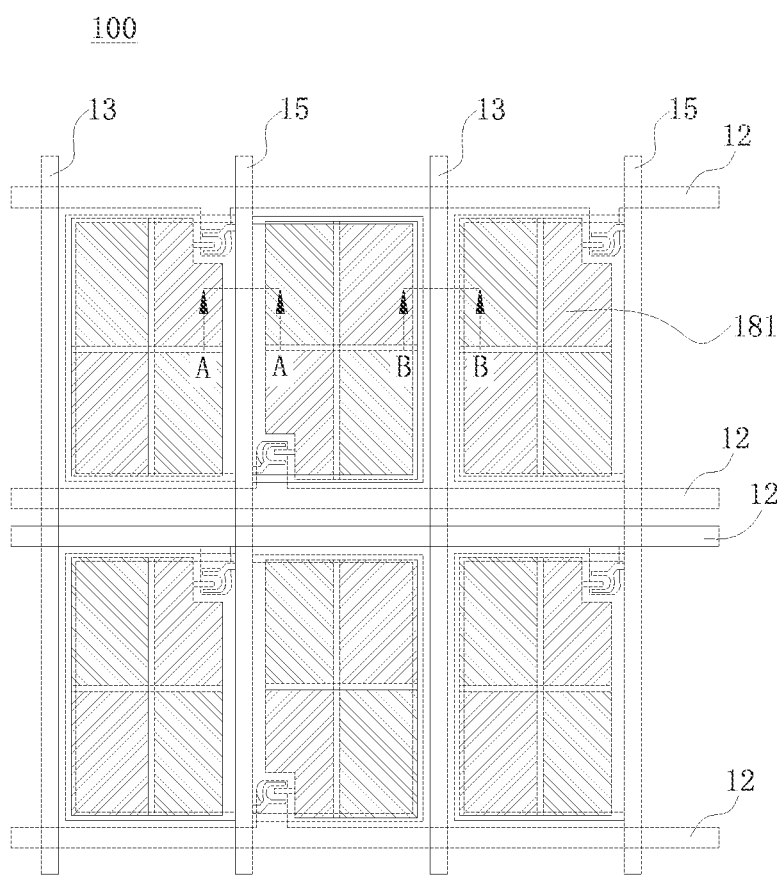
FIG. 2 is a plan view of the structure of the array substrate according to the embodiment of the present application.

The color filter layer 16 includes different color filters, which are first color filters 161, second color filters 162, and third color filters 163, respectively. As shown in FIGS. 1, 2 and 4, the first color filters 161 and the second color filters 162 are adjacent to each other in a direction perpendicular to the data lines 15, and the edges of each of the first color filters 161 and respective one second color filters 162 are located on a respective common electrode line 13, that is, the light is shielded by the common electrode lines 13 between the first color filters 161 and the second color filters 162 to avoid color mixing between them. Also, as shown in FIG. 4, a color filter channel 160 is formed between each of the first color filters 161 and the respective one of the second color filters 162.

In this embodiment, the first color filters 161 and the second color filters 162 do not overlap due to the color filter channels 160, thus the risk of mixing of colors between the first color filters 161 and the second color filters 162 can be avoided, which in turn, may reduce the line width of the common electrode lines 13 between the first color filters 161 and the second color filters 162, thereby contributing to a higher aperture rate.

Moreover, in this embodiment, as shown in FIG. 4, the array substrate 100 also includes a planarization layer 17, which includes a plurality of filling portions 171, each filling portion 171 is correspondingly filled in each color filter channel 160.

Further referring to FIG. 4, the pixel electrode layer 18 includes a plurality of pixel electrodes 181 disposed on the respective color filters. When forming the pixel electrode layer 18, a transparent conductive material layer and a photoresist layer are deposited on the color filter layer 16, and then parts between the respective color filters are etched away by exposure, development and etching, and the parts on top of the respective color filters are retained to obtain the corresponding pixel electrodes 181.

In this embodiment, the filling portions 171 filled in the color filter channels 160 flatten the connection between the first color filters 161 and the second color filters 162, and reduces a height difference between the color filter channels 160 and the color filters on both sides thereof. Therefore, the etching residue is not likely to occur when the transparent conductive material layer is deposited and etched, thus, problems such as short circuits between the two pixel electrodes 181 above the first color filters 161 and the second color filters 162 can be avoided, thus, ensuring proper etching yields and display effect.

Generally, in the actual manufacturing process, the depth of the color filter channels 160, namely the thickness of the color filters, is about 1.5-2.0 μm. However, without limitation, in other optional embodiments, the thickness of the color filters may have other ranges depending on the manufacturing process, and the like.

In an embodiment, the filling portions 171 may be formed from a transparent material, specifically a transparent organic material such as polyimide or polystyrene. The filling portions 171 can be obtained by applying a solution of the transparent organic material in a patterned coating manner to the color filter channels 160, and curing.

Without limitation, in other optional embodiments, the filling portions 171 may be formed from a transparent inorganic material, such as silicon dioxide, silicon nitride, and the like, which is deposited in the color filter channels 160 by means of patterned deposition to form the filling portions 171. Alternatively, in other optional embodiments, the filling portions 171 may be formed from an opaque material, such as black material, which needs to ensure that the black material filled in the color filter channels 160 does not obscure the aperture portions for screen display.

Optionally, as shown in FIG. 4, in this embodiment, the height of the filling portions 171 is equal to the depth of the color filter channels 160. In this way, an upper surface of the filling portions 171 is aligned at the same height as the color filters on both sides thereof. In this way, when the transparent conductive material layer is deposited on the filling portions 171, there is no significant height difference on both sides, thus, the problem of etching residue of the transparent conductive material layer can be significantly avoided.

Alternatively, in practice, the height of the filling portions 171 may be slightly greater than the depth of the color filter channels 160. In this way, the upper end of the filling portions 171 is higher than the color filters on both sides thereof, in addition to fill the color filter channels 160 completely, thus forming a height difference with the color filters on both sides thereof. However, on one hand, this height difference can be minimized easily by controlling the height of the fillings in the filling portions 171 without forming an excessive height difference that would affect the etching of the transparent conductive material layer, and on the other hand, since pixel areas having relatively large and open space are located on both sides of the upper end of the filling portions 171, so even with the height difference, the etching of the transparent conductive material layer will not be affected.

Alternatively, in practical applications, the height of the filling portions 171 can be slightly less than the depth of the color filter channels 160. Similarly, this can also improve the problem of etching residue of the transparent conductive material layer, which will not be described further.

Referring to FIGS. 1, 3 and 4, for illustrative purposes, the first color filters 161 are green color filters (G), the second color filters 162 are blue color filters (B) and the third color filters 163 are red color filters (R) in this embodiment. Without limitation, in other optional embodiments, the arrangement of the first color filters 161, the second color filters 162 and the third color filters 163 is not limited, and there may be other two adjacent color filters overlapping on top of different data lines 15. For example, as shown in FIG. 1, two color filters located on two sides of another data line 15 are a first color filter and a second color filter, respectively.

As shown in FIGS. 1 and 2, the common electrode lines 13 are parallel to the data lines 15, and the common electrode lines 13 and the data lines 15 are arranged alternately, namely, one common electrode line 13 is located between two adjacent data lines 15, and one data line 15 is located between two adjacent common electrode lines 13. The array substrate 100 also includes a plurality of scanning lines 12, which are disposed in a direction perpendicular to the common electrode lines 13 and the data lines 15. A pixel area is defined by one scanning line 12, one data line 15, and one common electrode line 13.

In this embodiment, as shown in FIGS. 1 and 2, a data line 15 is connected to two columns of pixel areas located on both sides thereof at the same time, while two scanning lines 12 are located between two adjacent rows of pixel areas. Of these two scanning lines 12, one scanning line 12 (G2) located above is connected to the pixel areas in columns of even numbers from the pixel areas in the row above the two scanning lines 12, and the other scanning line 12 (G3) located below is connected to the pixel areas in columns of odd numbers from the pixel areas in the row above the two scanning lines 12.

As shown in FIGS. 1 to 3, the edges of each first color filter 161 and each third color filter 163 are located above a corresponding data line 15, that is, the first color filters 161 and the third color filters 163 are located on the two sides of the data lines 15, respectively. The edges of the first color filters 161 and the edges of the third color filters 163 may overlap each other.

Referring to FIGS. 2 and 3, in one embodiment, the array substrate 100 further includes first common electrodes 14 having a frame-like shape. Each of the first common electrodes 14 is attached to either of the opposite sides of a respective common electrode line 13, and the first common electrodes 14 partially overlaps with the peripheral edges of each pixel electrodes 181. A storage capacitor is formed between the overlapping and insulated portions of the first common electrodes 14 and the pixel electrodes 181.

As shown in FIG. 3, the array substrate 100 also includes light-shielding electrodes 19 disposed on the color filter layer 16 at the overlapping edges of the first color filters 161 and the third color filters 163, which are used to shield the overlapping edges of the first color filters 161 and the third color filters 163 to prevent mixing of colors between two color filters.

Figure 9:
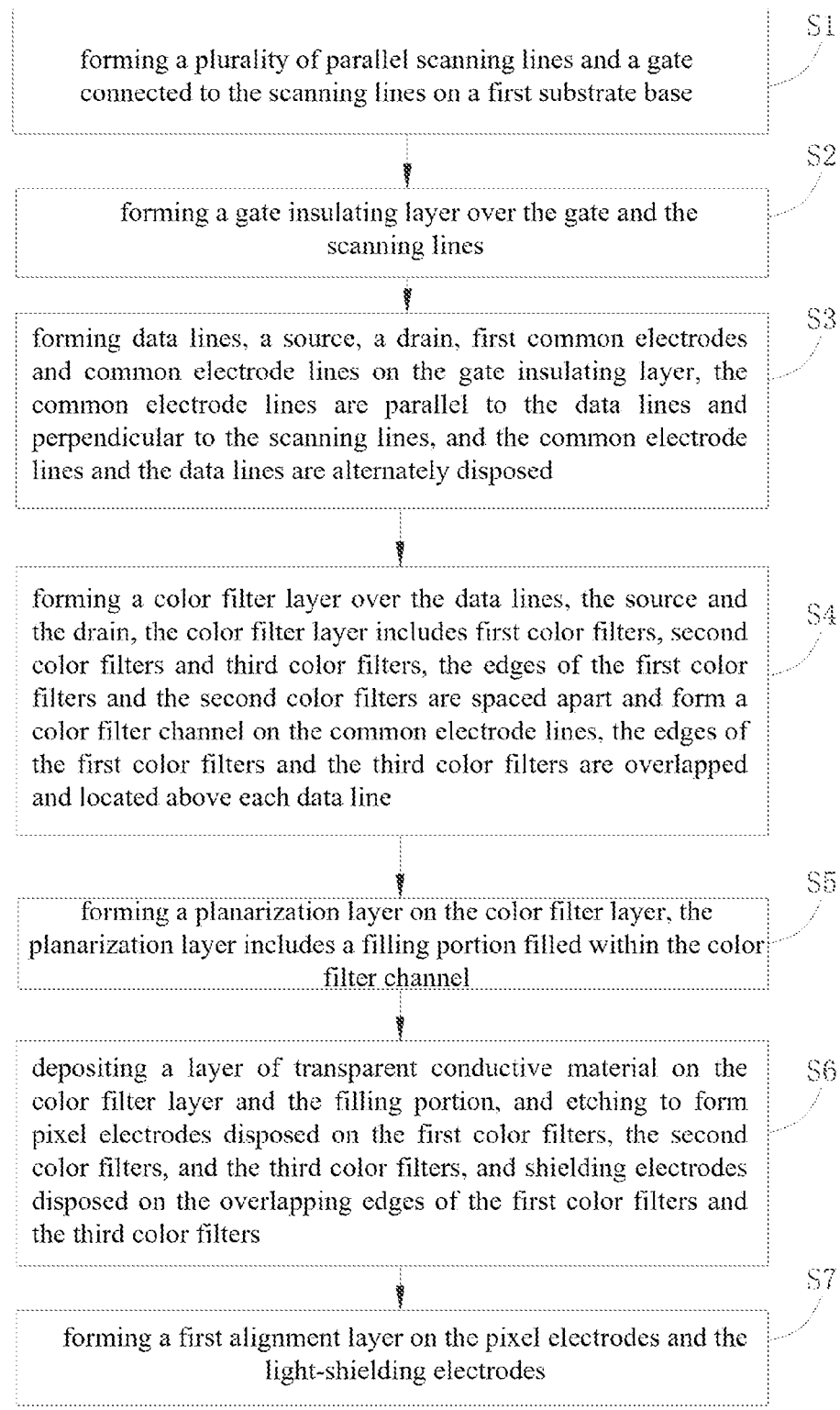
FIG. 9 is a flow chart of the manufacturing method for an array substrate according to a fifth embodiment of the present application.

Specifically, each light-shielding electrode 19 is connected to each common electrode line 13 through the first aperture 166 penetrating the color filter layer 16, so that the light-shielding electrodes 19 remain at the same potential as the common electrode lines 13 through electrical connection, and thus at the same potential as the second common electrode 2002 (which may be the upper common electrode provided on the color film substrate 200, as shown FIG. 9). When the liquid crystal molecules sandwiched between the pixel electrodes 181 and the upper common electrode are deflected by an applied voltage, the liquid crystal molecules sandwiched between the light-shielding electrodes 19 and the upper common electrode are not deflected, thus avoiding the problem of light exiting from one pixel area enters an adjacent pixel area via this region. Of course, a second aperture (not shown) penetrating the color filter layer 16 is also provided for the connection between the pixel electrodes 181 and a drain electrode (not shown) of the TFT.

Moreover, the light-shielding electrodes 19 are also able to shield the stray capacitance formed between the data lines 15 and the second common electrode 2002 caused by partially overlapping between the two.

Specifically, the light-shielding electrodes 19 are transparent electrodes, which are formed by a photomask process on the same layer as the pixel electrodes 18.

As shown in FIG. 3, in one embodiment, the width of each light-shielding electrode 19 is greater than the width of each data line 15, such that the edges of both sides of each light-shielding electrode 19 extend beyond the edges of each data line 15. The purpose of such a setting is to avoid light leakage on both sides of the data lines 15 due to the lateral electric field formed between the pixel electrodes 181 and the first common electrodes 14. Referring to FIGS. 3 and 4, the array substrate 100 also includes a first alignment layer 20 disposed on the pixel electrode layer 18 and the light-shielding electrodes 19. Orientation grooves (not shown in FIG. 1) that are regularly arranged on the first alignment layer 20 are formed for maintaining the liquid crystal molecules at a specific pre-tilt angle. The first alignment layer 20 may be specifically a polyimide layer.

Optionally, in this embodiment, the material of the filling portions 171 is the same as the material of the first alignment layer 20, both being polyimide. In this way, a better interfacial integration of the interface between the upper surface of the filling portions 171 and the lower surface of the first alignment layer 20 is ensured, that is, there is no obvious interface between the filling portions 171 and the first alignment layer 20.

Second Embodiment

Figure 5:
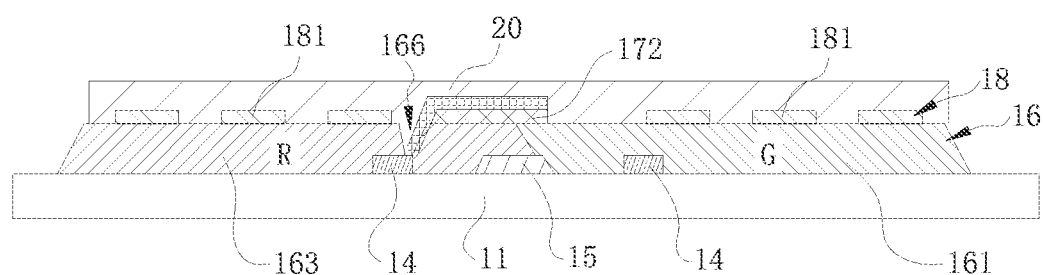
FIG. 5 is a cross-sectional view of the array substrate taken along line A-A according to a second embodiment of the present application.

Referring to FIG. 5, compared to the aforementioned first embodiment, the array substrate 100 provided in the present embodiment further includes shielding portions 172 disposed below respective light-shielding electrodes 19 and above the color filter layer 16, namely, the shielding portions 172 are formed on the edges where the first color filters 161 and the third color filters 163 overlap, and the light-shielding electrodes 19 is further formed on the shielding portions 172.

The shielding portions 172 are in a bar-like shape, parallel to the data lines 15.

Since the color filter layer 16 is formed by depositing and etching different color filter material layers in several times, for example, color filters R are formed first by depositing and etching, then color filters G are formed by depositing and etching, and finally color filters B are formed by depositing and etching, hence the edges of the first color filters 161 covers the edges of the third color filters 163. Moreover, as a result of factors such as the thickness control and the dry etching of the edge of the color filter material layer, defects like unevenness may still be formed between the edges of the first color filters 161 and the third color filters 163 (usually, the height difference formed by the unevenness defect is smaller than the depth of the color filter channels 160 mentioned above). Therefore, with the shielding portions 172, the overlapping edges of the first color filters 161 and the third color filters 163 can be further flattened, and which, in turn, can facilitate the deposition and etching of the material layer of the light-shielding electrodes 19 when the light-shielding electrodes 19 are formed on the shielding portions 172.

Additionally, in some cases, a relatively small amount of stray capacitance may be generated between the light-shielding electrodes 19 and the data lines 15 due to the significant length of the data lines 15 and the distribution of the data lines 15 over substantially the entire display area. Each of the shielding portions 172 are positioned between each light-shielding electrode 19 and each data line 15, which correspondingly increases the distance between the light-shielding electrodes 19 and the data lines 15 and, therefore, is able to reduce the stray capacitance between the light-shielding electrodes 19 and the data lines 15, thereby avoiding an increase in the load on the data lines 15.

Optionally, the width of each shielding portion 172 is greater than or equal to the width of each light-shielding electrode 19 and is spaced apart from the edge of the respective pixel electrode 181, such that a height difference on each light-shielding electrode 19 and pixel electrode 181 can be avoided, and the light-shielding electrode 19 and the pixel electrode 181 can each be kept relatively flat.

As shown in FIG. 5, in this embodiment, the width of the edge of each shielding portion 172 extending beyond the edge of each light-shielding electrode 19 may be greater than 0 and less than or equal to 2 μm to ensure a sufficient spacing from the pixel electrodes 181. In practical application, the width of the edge of the shielding portions 172 extending beyond the edge of the light-shielding electrodes 19 may be adjusted depending on the process, which is not specifically limited.

In this embodiment, the shielding portions 172 are formed with the filling portions 171 by a single process, such as a patterned coating or a patterned deposition process as described in the above-mentioned first embodiment, which is not repeated herein.

Optionally, in this embodiment, the thickness of the shielding portions 172 may be greater than 0 and less than or equal to 3 μm. Optionally, the thickness of the shielding portions 172 is 1-2 μm.

Third Embodiment

Figure 6:
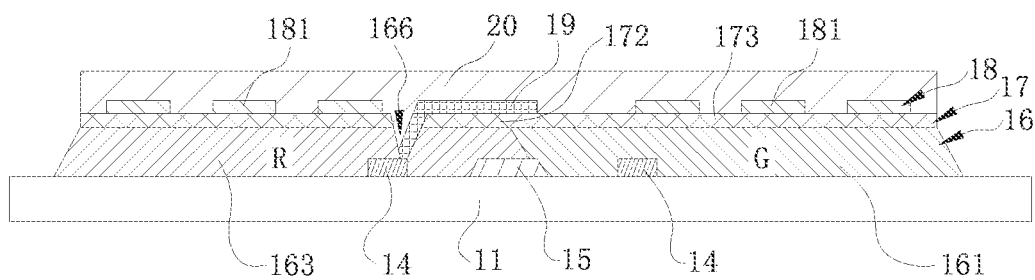
FIG. 6 is a cross-sectional view of the array substrate taken along line A-A according to a third embodiment of the present application.
Figure 7:
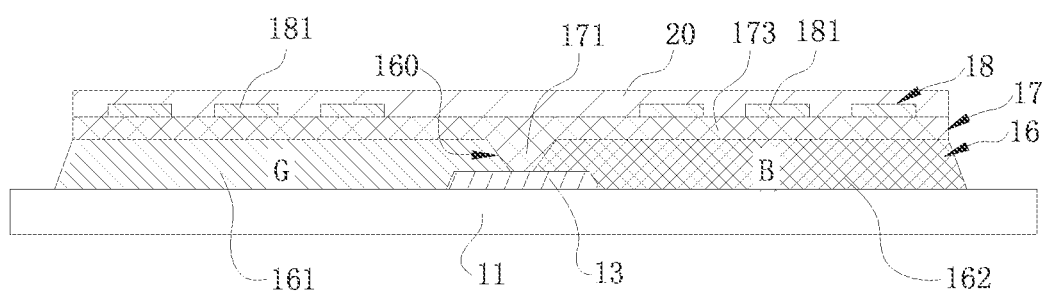
FIG. 7 is a cross-sectional view of the array substrate taken along line B-B according to the third embodiment of the present application.

FIGS. 6 and 7 show a third embodiment of the array substrate 100 provided in this application, which differs from the above-mentioned first and second embodiments in that the planarization layer 17 is substantially a layer structure fully extending between the pixel electrode layer 18 and the color filter layer 16. As shown in FIG. 3, the planarization layer 17 includes, in addition to the filling portions 171 filled in the color filter channels 160 and the shielding portions 172 covering the overlapping edges of the first color filters 161 and the third color filters 163, planarization portions 173 located above the color filters and the filling portions 171. It is understood that the planarization portions 173 avoid the above-mentioned first aperture 166 and the second aperture.

That is, before the pixel electrode layer 18 and the light-shielding electrodes 19 are formed, the color filter channels 160 are first filled by the planarization layer 17, and a substantially continuous and complete layer structure is formed as the planarization portions 173 and the shielding portions 172 (the planarization portions 173 and the shielding portions 172 are connected without substantial boundary therebetween, as shown in FIG. 6). Accordingly, intersection of different material layers can be prevented, or the change in the height can be continuous during the deposition of the transparent conductive material layer, which facilitates the preparation of the pixel electrodes 181 and ensures the etching yield.

In this embodiment, the filling portions 171, the shielding portions 172, and the planarization portions 173 are made of the same material in a single process. Therefore, the planarization layer 17 as an entirety is a transparent material layer, to avoid influence on the light transmission in the aperture area of respective pixel electrode 181.

Optionally, in an embodiment, the planarization layer 17 is a transparent organic material layer.

Accordingly, the transparent organic material layer may be formed by patterned coating: applying a solution of transparent organic material on the color filter layer 16, a portion of the solution being first filled into the color filter channel 160 under fluidity, and then forming a structural layer of uniform and continuous thickness on each color filter, so that the shielding portions 172 and the planarization portions 173 are formed. The color filter channels 160 are completely filled with the filling portions 171 with an upper surface of the filling portions 171 aligned with the upper surface of the color filters, and the planarization portions 173 are formed on top of the filling portions 171 and the color filters, as shown in FIG. 7.

In this embodiment, the boundaries between the surfaces of planarization portions 173 and the shielding portions 172 are smooth without a height difference, thereby facilitating the etching of the pixel electrodes 18 and the light-shielding electrodes 19.

In this embodiment, the thickness of the planarization portions 173 and the shielding portions 172 may be greater than 0 and less than or equal to 3 μm. Optionally, the thickness of the planarization portions 173 and the shielding portions 172 is 1-2 μm. In a specific application, the thickness of the planarization portions 173 and the shielding portions 172 is determined according to the process and the procedure and is not limited herein.

Alternatively, in another embodiment, the planarization layer 17 is a transparent inorganic material layer.

Accordingly, the transparent inorganic material layer may be produced by patterned chemical vapor deposition: a plurality of target material molecules in gaseous or vapor form react on the surface of the color filter layer 16 to form a deposited layer. Generally, a uniform thickness is obtained across the deposited layer, so that a height difference still exists between the planarization portions 173 and the filling portions 171. However, based on the structural characteristics of the color filter channels 160, which is wider at the top and narrower at the bottom, the inorganic transparent material is easier to be filled therein, thus, the height difference is less than the depth of the color filter channels 160. Moreover, with respect to the color filter channels 160, the height difference is topographically smoother and more continuous, thus, etching residue of the transparent conductive material can still be significantly improved or even avoided.

In this embodiment, the thickness (total thickness of material deposited) of the planarization portions 173 and the shielding portions 172 is optionally greater than 0 and less than or equal to 3 μm. Optionally, the thickness of the planarization portions 173 and the shielding portions 172 is 1-2 μm, for example, greater than the depth of the color filter channels 160. In a specific application, the thickness of the planarization portions 173 and the shielding portions 172 is determined according to the process and procedure therefore is not specifically limited herein.

Fourth Embodiment

Figure 8:
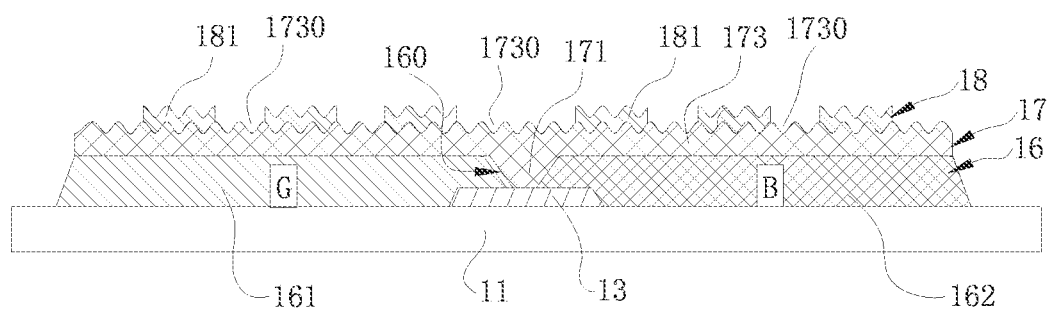
FIG. 8 is a cross-sectional view of the array substrate taken along line B-B according to a fourth embodiment of the present application.

FIG. 8 shows a fourth embodiment of the array substrate 100 provided in this application, which differs from the above third embodiment in that, in this embodiment, the first alignment layer 20 is replaced by orientation grooves 1730 formed on the surface of the planarization portions 173, which serve as an alignment layer at the same time.

In a specific process, after the material layer (for example, a layer of transparent organic material) of the planarization layer 17 is formed by the patterned coating, the material layer can be embossed by a roller having a specific pattern to form a specific channel. Stable orientation grooves 1730 are formed after the material layer is cured, and the pixel electrode layer 18 is then deposited and etched on the planarization portions 173 of the planarization layer 17.

With this arrangement, the use of one alignment layer material and one coating process is saved, thus reducing the material cost and process cost of the array substrate 100.

Fifth Embodiment

As shown in FIG. 9, a manufacturing method for the array substrate 100 is provided in a fifth embodiment of the present application, which includes:

Step S1: forming a plurality of parallel scanning lines 12 and a gate (not shown) connected to the scanning lines 12 on a first substrate base 11;

Step S2: forming a gate insulating layer (not shown) over the gate and the scanning lines 12;

Step S3: forming data lines 15, a source, a drain, first common electrodes 14 and common electrode lines 13 on the gate insulating layer, the common electrode lines 13 being parallel to the data lines 15 and perpendicular to the scanning lines 12, and the common electrode lines 13 and the data lines 15 being alternately disposed;

both sides of each common electrode line 13 are respectively attached with one first common electrode 14 having a frame-like shape;

Step S4: forming a color filter layer 16 over the data lines 15, the source and the drain, the filter layer 16 including first color filters 161, second color filters 162 and third color filters 163, the edges of the first color filters 161 and the second color filters 162 being spaced apart and forming a color filter channel 160 on each common electrode line 13, the edges of the first color filters 161 and the third color filters 163 being overlapped and located above each data line 15;

Step S5: forming a planarization layer 17 on the color filter layer 16, the planarization layer 17 including filling portions 171 filled within the color filter channels 160;

Step S6: depositing a layer of transparent conductive material on the color filter layer 16 and the filling portions 171, and etching to form pixel electrodes 181 disposed on the first color filters 161, the second color filters 162, and the third color filters 163, and light-shielding electrodes 19 disposed on the overlapping edges of the first color filters 161 and the third color filters 163; and Step S7: forming a first alignment layer 20 on the pixel electrodes 181 and the light-shielding electrodes 19.

In an embodiment, the filling portions 171 may be formed from a transparent material, specifically, may be formed from a transparent organic material such as polyimide or polystyrene. In step S5, the filling portions 171 may be obtained by applying a solution of the transparent organic material in the color filter channel 160 by patterned coating, followed by curing. Alternatively, the filling portions 171 may be formed from a transparent inorganic material, such as silicon dioxide, silicon nitride, and the like, accordingly in step S5, the filling portions 171 are formed by patterned deposition into the color filter channels 160.

Alternatively, in other optional embodiments, the filling portions 171 may be formed from an opaque material, such as a black material, with the black material filled in the color filter channels 160 and avoiding the aperture area for screen display.

In an embodiment, in step S5, the planarization layer 17 further includes shielding portions 172, which are in a bar-like shape covering the overlapping edges of the first color filters 161 and the third color filters 163 and are parallel to the data lines 15. In step S6, the light-shielding electrodes 19 are formed over the shielding portions 172.

Optionally, the width of each of the shielding portions 172 is greater than or equal to the width of each light-shielding electrode 19, and the shielding portions 172 are spaced apart from the edges of the pixel electrodes 181. The width of the edge of each shielding portion 172 extending beyond the edge of each light-shielding electrode 19 may be greater than 0 and less than or equal to 2 μm. In step S5, the shielding portions 172 and the filling portions 171 are formed by a single process, such as a patterned coating or a patterned deposition process, details are as described in the above-mentioned embodiment, and will not be repeated herein.

Optionally, in this embodiment, the thickness of the shielding portions 172 may be greater than 0 and less than or equal to 3 μm. Further optionally, the thickness of the shielding portions 172 is 1-2 μm.

In an embodiment, in step S5, the planarization layer 17 also includes planarization portions 173 disposed on the color filters and connected to the filling portions 171 and the shielding portions 172. The filling portions 171, the shielding portions 172 and the planarization portions 173 are formed from the same material and by the same process. Therefore, the planarization portions 173 form transparent material layer to ensure that the transmission of light in the aperture area corresponding to each pixel electrode 181 is not disturbed.

In an optional embodiment, the planarization layer 17 is a transparent organic material layer.

Accordingly, the transparent organic material layer may be formed by patterned coating: applying a solution of transparent organic material on the color filter layer 16, a portion of the solution being first filled into the color filter channels 160 under fluidity, and then forming a structural layer of uniform and continuous thickness on each color filter, so that the shielding portions 172 and the planarization portions 173 are formed. The color filter channels 160 are completely filled with the filling portions 171 with an upper surface of the filling portions 171 aligned with the upper surface of the color filters, and the planarization portions 173 are formed on top of the filling portions 171 and the color filters.

Alternatively, in another embodiment, the planarization layer 17 is a transparent inorganic material layer.

Accordingly, the transparent inorganic material layer may be produced by patterned chemical vapor deposition: forming a deposited layer by the reaction of a plurality of target material molecules in gaseous or vapor form on the surface of the color filter layer 16. Generally, a uniform thickness is obtained across the deposited layer, so that a height difference still exists between the planarization portions 173 and the filling portions 171. However, based on the structural characteristics of the color filter channels 160, wider at the top and narrower at the bottom, the inorganic transparent material is easier to be filled therein, thus, the height difference is less than the depth of the color filter channels 160. Moreover, with respect to the color filter channels 160, the height difference is topographically smoother and more continuous, thus, etching residue of the transparent conductive material can still be significantly improved or even avoided.

In this embodiment, the thickness (total thickness of material deposited) of the planarization portions 173 and the shielding portions 172 is optionally greater than 0 and less than or equal to 3 μm. Optionally, the thickness of the planarization portions 173 and the shielding portions 172 is 1-2 μm, for example, greater than the depth of the color filter channels 160.

In an optional embodiment, the above step S7 may be omitted and replaced by embossing the material layer of the planarization layer 17 by means of roller embossing in step S5 to obtain a planarization portion 173 having orientation grooves 1730 on the surface thereof, so that the planarization layer 17 is also used as an alignment layer, as shown with reference to the aforementioned FIG. 8.

Sixth Embodiment

Figure 10:
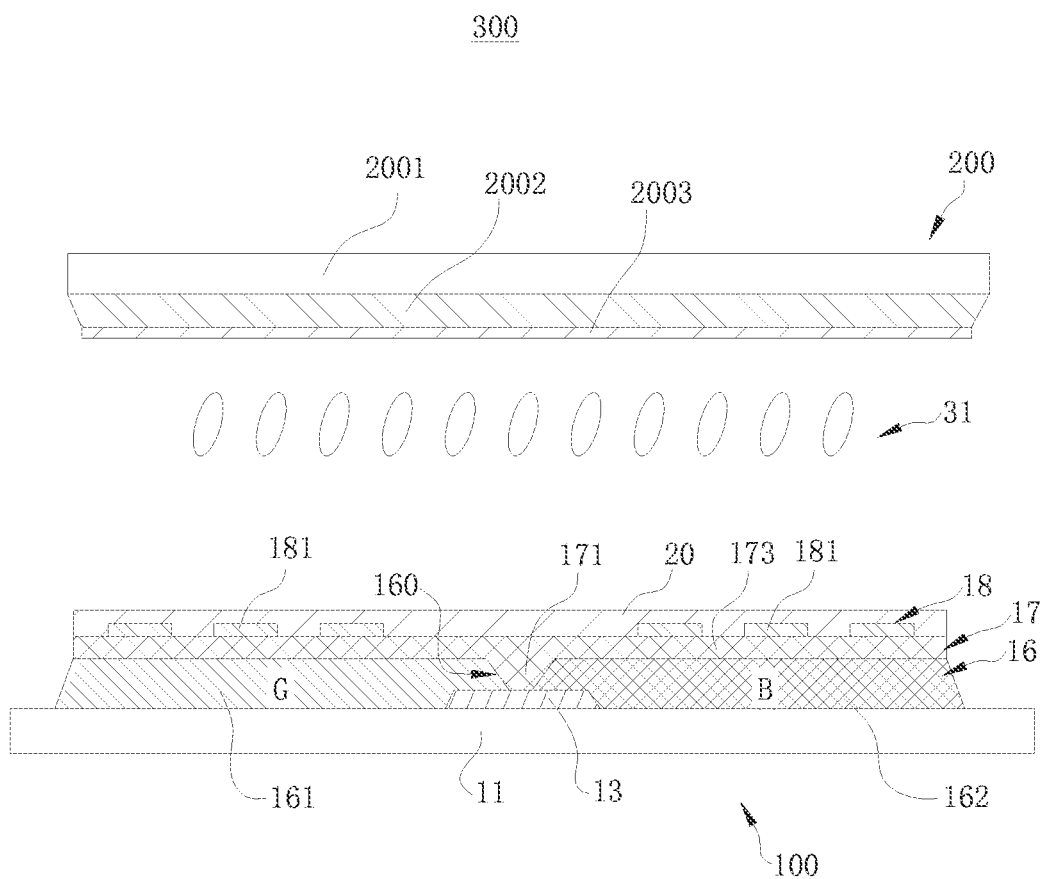
FIG. 10 is a schematic diagram showing the structure of the display panel according to a sixth embodiment of the present application.

As shown in FIG. 10, a sixth embodiment of the present application provides a display panel 300 including a color film substrate 200, the array substrate 100 in the above embodiments, and a liquid crystal layer 31 sandwiched between the color film substrate 200 and the array substrate 100.

The display panel 300 of the present embodiment includes the array substrate 100, which has the color filter channels 160 formed between the first color filters 161 and the second color filters 162 over the common electrode lines 13, so that the mixing of colors in the region between the first color filters 161 and the second color filters 162 can be avoided. Accordingly, the width of the common electrode lines 13 arranged between the first color filters 161 and the second color filters 162 can be reduced so as to increase the aperture rate. Moreover, the color filter channels 160 are filled by the filling portions 171, so that the connection between the first color filters 161 and the second color filters 162 is flattened, reducing the height difference between the color filter channels 160 and the color filters on both sides thereof, hence when the transparent conductive material layer is deposited and etched, the etching residue can be prevented, and problems such as short circuits between the two pixel electrodes 181 positioned above the first color filters 161 and the second color filters 162 can also be avoided, thus, ensuring the etching yields and display effect. With the filling portions 171, parts of the first alignment layer 20 above the color filter channels 160 can also become flatter, reducing the factors causing the abnormal deflection of the liquid crystal molecules, thus ensuring that the liquid crystal molecules above the color filters on both sides are deflected normally, thereby also avoiding the light leakage to a certain extent.

As shown in FIG. 10, the color film substrate 200 includes a second substrate base 2001, a second common electrode 2002 disposed on the second substrate base 2001, and a second alignment layer 2003 disposed on the second common electrode 2002.

In addition, in an embodiment, the color film substrate 200 further includes a black matrix layer (not shown) that includes a plurality of black matrix strips, each aligned with each of the scanning lines 12 for blocking the area along the direction of the scanning lines 12 between respective color filters.

Seventh Embodiment

Figure 11:
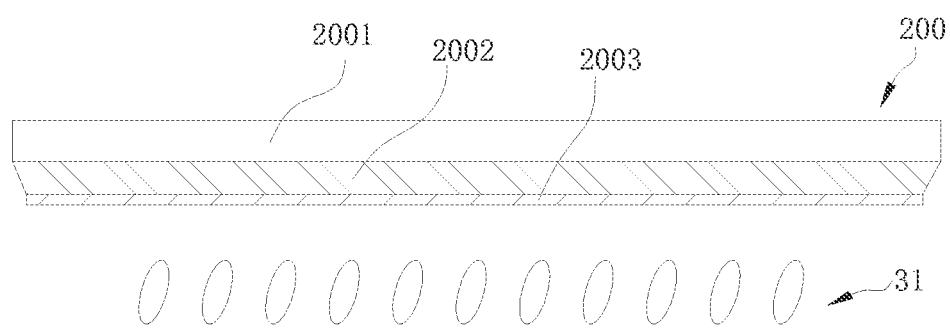
FIG. 11 is a schematic diagram showing the structure of the display device according to a seventh embodiment of the present application.
Figure 11:
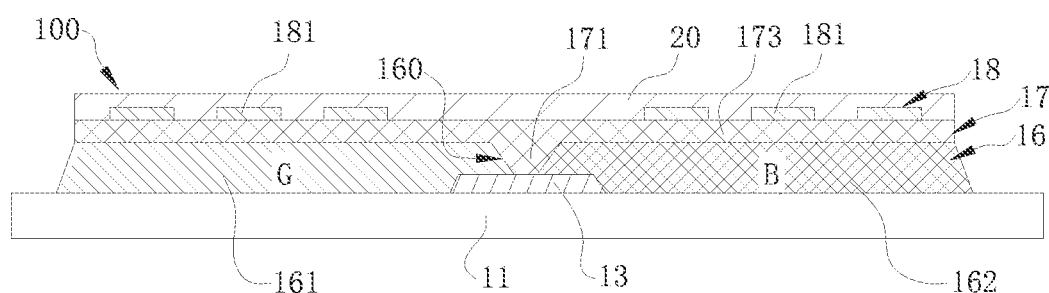
Figure 11:

As shown in FIG. 11, a seventh embodiment of the present application provides a liquid crystal display device 400 including a backlight module 41 and the display panel 300 in the fifth embodiment. The display device 400 has the technical effects corresponding to the above-mentioned display panel 300 and will not be described herein.

The above are merely optional embodiments of the present application, and are not intended to limit the present application. Any modification, equivalent replacement, and improvement made within the spirit and principle of the present application shall fall within the scope of protection of the present application.

What is claimed is:

1. An array substrate, comprising:
   a first substrate base;
   common electrode lines disposed on the first substrate base;
   a color filter layer disposed on the first substrate base, the color filter layer comprising first color filters and second color filters adjacent to the first color filters, and the first color filters and the second color filters adjacent to the first color filters form color filter channels on the common electrode lines;
   a planarization layer comprising filling portions, and the filling portions are filled in the color filter channels; and
   a plurality of data lines disposed on the first substrate base, wherein the plurality of data lines is disposed parallel to and alternating with the common electrode lines, the color filter layer further comprises third color filters, and an edge of each of the third color filters and an edge of a respective one of the first color filters overlap over a corresponding one of the plurality of data lines.

2. The array substrate according to claim 1, further comprising:
   a pixel electrode layer disposed on the color filter layer, wherein the pixel electrode layer comprises a plurality of pixel electrodes and a part of the plurality of pixel electrodes disposed on the third color filters and another part of the plurality of pixel electrodes disposed on the first color filters are connected to a same data line.

3. The array substrate according to claim 2, wherein the planarization layer further comprises transparent planarization portions, the transparent planarization portions are disposed on the first, second, and third color filters and are connected to the filling portions, respectively.

4. The array substrate according to claim 3, wherein the filling portions and the transparent planarization portions are in a same layer, the planarization layer is provided with orientation grooves, and the plurality of pixel electrodes are disposed on the transparent planarization portions, respectively; or,
   the array substrate further comprises an alignment layer disposed on the pixel electrode layer.

5. The array substrate according to claim 1, wherein the planarization layer further comprises:
   shielding portions disposed above overlapping edges of the third color filters and the first color filters, and the shielding portions are parallel to the plurality of data lines.

6. The array substrate according to claim 5, further comprising light-shielding electrodes, wherein the light-shielding electrodes are disposed on the shielding portions and connected to the common electrode lines; and
   a width of each of the light-shielding electrodes is greater than a width of each of the plurality of data lines.

7. The array substrate according to claim 6, wherein a width of each of the shielding portions is greater than the width of each of the light-shielding electrodes, and an excessive width of each of the shielding portions beyond each of the light-shielding electrodes is less than or equal to 2 μm.

8. A display panel, comprising:
   a color film substrate;
   an array substrate comprising a first substrate base and common electrode lines disposed on the first substrate base; and
   a liquid crystal layer disposed between the array substrate and the color film substrate;
   wherein the array substrate further comprises:
   a color filter layer disposed on the first substrate base, the color filter layer comprising first color filters and second color filters adjacent to the first color filters, and the first color filters and the second color filters form color filter channels therebetween on the common electrode lines;
   a planarization layer comprising filling portions, the filling portions are filled in the color filter channels; and
   a plurality of data lines disposed on the first substrate base, wherein the plurality of data lines is disposed parallel to and alternating with the common electrode lines, the color filter layer further comprises third color filters, an edge of each of the third color filters, and an edge of a respective one of the first color filters overlap over a corresponding one of the plurality of data lines.

9. The display panel according to claim 8, wherein the array substrate further comprises a pixel electrode layer disposed on the color filter layer, the pixel electrode layer comprises a plurality of pixel electrodes; and a part of the plurality of pixel electrodes disposed on the third color filters and another part of the plurality of pixel electrodes disposed on the first color filters are connected to a same data line.

10. The display panel according to claim 9, wherein the planarization layer further comprises transparent planarization portions, the transparent planarization portions are disposed on the first, second, and third color filters and are connected to the filling portions, respectively.

11. The display panel according to claim 10, wherein the filling portions and the transparent planarization portions are in a same layer, the planarization layer is provided with orientation grooves, and the plurality of pixel electrodes are disposed on the transparent planarization portions, respectively; or, the array substrate further comprises an alignment layer disposed on the pixel electrode layer.

12. The display panel according to claim 8, wherein the planarization layer further comprises:

shielding portions disposed above overlapping edges of the third color filters and the first color filters, and the shielding portions are parallel to the plurality of data lines.

13. The display panel according to claim 12, further comprising light-shielding electrodes, wherein the light-shielding electrodes are disposed on the shielding portions and connected to the common electrode lines; and a width of each of the light-shielding electrodes is greater than a width of each of the plurality of data lines.

14. The display panel according to claim 13, wherein a width of each of the shielding portions is greater than the width of each of the light-shielding electrodes, and an excessive width of each of the shielding portions beyond each of the light-shielding electrodes is less than or equal to 2 μm.

\* \* \* \* \*